(12) United States Patent
Ohmi et al.

(10) Patent No.: US 9,812,302 B2
(45) Date of Patent: *Nov. 7, 2017

(54) MAGNETRON SPUTTERING APPARATUS

(75) Inventors: Tadahiro Ohmi, Sendai (JP); Tetsuya Goto, Sendai (JP); Takaaki Matsuoka, Tokyo (JP)

(73) Assignees: NATIONAL UNIVERSITY CORPORATION TOHOKU UNIVERSITY, Sendai-Shi, Miyagi (JP); TOKYO ELECTRON LIMITED, Tokyo (JP)

( * ) Notice: Subject to any disclaimer, the term of this patent is extended or adjusted under 35 U.S.C. 154(b) by 1387 days.

This patent is subject to a terminal disclaimer.

(21) Appl. No.: 12/531,515

(22) PCT Filed: Mar. 14, 2008

(86) PCT No.: PCT/JP2008/054730
§ 371 (c)(1),
(2), (4) Date: Sep. 16, 2009

(87) PCT Pub. No.: WO2008/114718
PCT Pub. Date: Sep. 25, 2008

(65) Prior Publication Data
US 2010/0101945 A1    Apr. 29, 2010

(30) Foreign Application Priority Data

Mar. 16, 2007 (JP) .................................. 2007-067940
Apr. 5, 2007 (JP) .................................. 2007-099778

(51) Int. Cl.
*H01J 37/32* (2006.01)
*H01J 37/34* (2006.01)
*C23C 14/35* (2006.01)

(52) U.S. Cl.
CPC .......... *H01J 37/3455* (2013.01); *C23C 14/35* (2013.01); *H01J 37/32495* (2013.01);
(Continued)

(58) Field of Classification Search
CPC .. H01J 37/3455; H01J 37/3441; H01J 37/345; H01J 37/3452; H01J 37/3408; H01J 37/3405; H01J 37/32495; C23C 14/35
(Continued)

(56) References Cited

U.S. PATENT DOCUMENTS 4,194,962 A * 3/1980 Chambers et al. ...... 204/298.23
4,374,722 A * 2/1983 Zega ........................ 204/298.03
(Continued)

FOREIGN PATENT DOCUMENTS

EP    1953257 A1    8/2008
GB    2393321 A *   3/2004
(Continued)

OTHER PUBLICATIONS

International Search Report for PCT/JP2008/054730, dated Jun. 3, 2008.
(Continued)

*Primary Examiner* — Michael Band
(74) *Attorney, Agent, or Firm* — Pearne & Gordon LLP

(57) ABSTRACT

In a magnetron sputtering apparatus configured such that a magnetic field pattern on a target surface moves with time by means of a rotary magnet group, it is to solve a problem that the failure rate of substrates to be processed becomes high upon plasma ignition or extinction, thereby providing a magnetron sputtering apparatus in which the failure rate of the substrates is smaller than conventional. In a magnetron sputtering apparatus, a plasma shielding member having a slit is disposed on an opposite side of a target with respect to a rotary magnet group. The distance between the plasma (Continued)

shielding member and the substrate is set shorter than the electron mean free path or the sheath width. Further, the width and the length of the slit are controlled to prevent impingement of plasma on the processing substrate. This makes it possible to reduce the failure rate of the substrates.

7 Claims, 11 Drawing Sheets

(52) U.S. Cl.
CPC ........ *H01J 37/345* (2013.01); *H01J 37/3405* (2013.01); *H01J 37/3408* (2013.01); *H01J 37/3441* (2013.01); *H01J 37/3452* (2013.01)

(58) Field of Classification Search
USPC .............. 204/298.12, 298.16, 298.17, 298.2, 204/298.22, 298.21
See application file for complete search history.

(56) References Cited

U.S. PATENT DOCUMENTS

| | | | |
|---|---|---|---|
| 5,833,815 | A | 11/1998 | Kim et al. |
| 6,562,200 | B2 | 5/2003 | Iwase et al. |
| 2005/0133365 | A1* | 6/2005 | Hong et al. ................ 204/298.2 |
| 2005/0252763 | A1* | 11/2005 | Chistyakov ............. 204/192.12 |
| 2007/0175748 | A1* | 8/2007 | Atamny et al. ............ 204/192.1 |
| 2007/0175749 | A1* | 8/2007 | Schneider et al. ......... 204/192.1 |
| 2010/0059368 | A1* | 3/2010 | Ohmi et al. ............. 204/298.11 |
| 2010/0126848 | A1* | 5/2010 | Ohmi et al. ............. 204/192.12 |
| 2010/0126852 | A1* | 5/2010 | Ohmi et al. ............. 204/298.03 |
| 2011/0000783 | A1* | 1/2011 | Ohmi et al. ............. 204/192.15 |
| 2012/0064259 | A1* | 3/2012 | Ohmi et al. ................... 427/571 |

FOREIGN PATENT DOCUMENTS

| | | |
|---|---|---|
| JP | 10-47862 A | 2/1989 |
| JP | 05-148642 A | 6/1993 |
| JP | 07-090569 A | 4/1995 |
| JP | 10-072665 A | 3/1998 |
| JP | 2000-309867 A | 11/2000 |
| JP | 2001-026869 A | 1/2001 |
| JP | 2001-032067 A | 2/2001 |
| JP | 3566327 B2 | 6/2004 |
| KR | 10-0262768 B1 | 5/2000 |
| KR | 10-0450380 B1 | 9/2004 |
| KR | 2006-0121347 A | 11/2006 |
| WO | 2007-043476 A1 | 4/2007 |
| WO | WO 2007071719 A1 * | 6/2007 |

OTHER PUBLICATIONS

Korean Office action for 10-2009-7020501 dated Jun. 16, 2011.
Japanese Office action for 2009-505194 dated Aug. 17, 2011.
Japanese Office action for 2009-505194 dated Mar. 9, 2011.

* cited by examiner

1. No magnetic circuit is formed.
2. A paramagnetic member (relative magnetic permeability 100) is provided under a fixed outer peripheral magnetic shell.
3. A magnetic circuit is formed between a paramagnetic member under a fixed outer peripheral magnetic shell and a columnar rotary shaft.

MAGNETRON SPUTTERING APPARATUS

TECHNICAL FIELD

This invention relates to a magnetron sputtering apparatus being a processing apparatus for applying predetermined surface treatment to a processing object such as a liquid crystal display substrate or a semiconductor substrate.

BACKGROUND ART

In the manufacture of a liquid crystal display element, a semiconductor element such as an IC, or the like, a thin film forming process is indispensably necessary so as to form a thin film of a metal, an insulating material, or the like on a substrate thereof. In this process, a film forming method is often performed by a sputtering apparatus that uses a raw material for thin film formation as a target, converts an argon gas or the like into plasma by DC high voltage or high-frequency power, and activates the target by the plasma-converted gas so that the target is melted and dispersed to be coated on a substrate to be processed.

Such a sputtering film forming method tends to be mainly directed to a film forming method which uses a magnetron sputtering apparatus in order to raise the film forming rate. Specifically, the magnetron sputtering apparatus has magnets disposed on the back side of a target to generate the lines of magnetic force parallel to a target surface and to thereby confine plasma to the target surface to obtain high-density plasma.

FIG. 16 is a diagram for explaining the structure of the main part of a magnetron sputtering apparatus according to the prior art described above, wherein 101 denotes a target, 102 a substrate to be processed, i.e., to be formed with a thin film, 103 a plurality of magnets, 104 lines of magnetic force, and 105 regions where the target 101 is melted and separated, i.e. erosion regions.

As shown in FIG. 16, the plurality of magnets 103 are disposed on the back side of the target 101 with their N-poles and S-poles oriented in predetermined directions, respectively, and the high-frequency power (RF power) 106 or the DC high-voltage power 107 is applied between the target 101 and the substrate 102 to excite plasma on the target 101.

On the other hand, around the plurality of magnets 103 disposed on the back side of the target 101, the lines of magnetic force 104 are generated toward the S-poles from the adjacent N-poles. At a position where a vertical magnetic field (magnetic force line components perpendicular to a target surface) is zero on a target surface, a horizontal magnetic field (magnetic force line components parallel to the target surface) becomes locally maximum. In a region where the amount of horizontal magnetic field components is large, electrons are captured near the target surface to form high-density plasma, and thus, the erosion region 105 is formed at this position centered.

Since the erosion regions 105 are each exposed to high-density plasma as compared with the other regions, the target 101 is intensively consumed. When the film formation is continued so that the target material is used up in these regions, it is necessary to replace the entire target. As a result, the utilization efficiency of the target 101 becomes low and further there is a tendency that, with respect also to the thickness of a thin film on the substrate 102 disposed facing the target 101, the film thickness at positions facing the erosion regions 105 becomes greater so that the film thickness uniformity over the entire processing substrate 102 is deteriorated.

In view of this, there have conventionally been proposed techniques of using bar magnets as magnets for generating magnetic fields and moving erosion regions with time by moving or rotating the bar magnets, thereby substantially preventing local consumption of a target on the time average and further improving the film thickness uniformity of a substrate (see Patent Documents 1 to 3).

In these techniques, each bar magnet has, on its opposite surfaces in a diameter direction, an N-pole array and an S-pole array, each having the same magnetic poles, arranged parallel to a longitudinal direction thereof or has, on its opposite surfaces in a diameter direction, an N-pole array and an S-pole array, each having the same magnetic poles, arranged helically with respect to a longitudinal direction thereof. Further, in order to allow erosion regions to form a closed circuit in the target, fixed bar magnets are disposed around the movable or rotatable bar magnets. Each of the fixed bar magnets has, on its opposite surfaces in a diameter direction, an N-pole array and an S-pole array, each having the same magnetic poles, arranged parallel to a longitudinal direction thereof. Ions/electrons are irradiated onto a front surface of the substrate in an instantaneous transient state when plasma for film formation is ignited or extinguished.

Patent Document 1: JP-A-H5-148642
Patent Document 2: JP-A-2000-309867
Patent Document 3: JP-B-3566327

DISCLOSURE OF THE INVENTION

Problem to be Solved by the Invention

In the above-mentioned conventional techniques, however, if an attempt is made to increase the moment-to-moment erosion densities, i.e. to increase the ratio of the erosion regions with respect to the entire target region, for increasing the rate of film formation on the substrate, it is necessary to enhance the strength of the bar magnets and further to cause the compact bar magnets to approximate each other. However, if such a structure is employed, there has been a problem that the magnets or fixing rods are deformed due to repulsion or attraction between the magnets or it becomes difficult to carry out movement or rotation against such a force.

Further, when the rotatable magnets rotate with the bar magnets fixed and located adjacent to the bar magnets, the same phase inevitably appears between the magnetic poles of the rotatable magnets and the magnetic poles of the fixed bar magnet. In this case, no closed erosion loop is formed. Further, there has been a problem of charge-up damage such as insulating film breakdown due to charge-up of the substrate caused by irradiation of ions/electrons of plasma onto the substrate in an instantaneous transient state when the plasma is ignited or extinguished.

Further, there has been a problem that if sputtered particles adhere to a shielding member, such as a deposition preventing plate or a ground plate, other than the substrate and the long-term operation is implemented, an adhering film becomes thick and is separated in a region where many particles reach so that rubbish is generated. If the rubbish is generated, it is necessary to once open a process chamber to the atmosphere and to replace the shielding member or the like adhered with a film in large quantities and thus high-efficiency film forming operation cannot be achieved.

Therefore, this invention has been made in view of the above-mentioned conventional problems and has an object to provide a magnetron sputtering apparatus that improves the film forming rate by increasing the moment-to-moment erosion densities on a target.

Further, it is another object of this invention to provide a magnetron sputtering apparatus that prolongs the life of a target by moving an erosion region with time to prevent local wear of the target, thereby realizing uniform consumption thereof.

Further, it is another object of this invention to provide a magnetron sputtering apparatus that prevents the occurrence of charge-up damage to a substrate to be processed.

It is still another object of this invention to provide a magnetron sputtering apparatus that realizes high-efficiency film forming operation by realizing a shielding member from which an adhering film is difficult to be separated, or by separating an adhering film from a shielding member without opening a process chamber to the atmosphere.

It is another object of this invention to provide a method of cleaning the inside of a magnetron sputtering apparatus.

Means for Solving the Problem

According to a first aspect of this invention, there is provided a magnetron sputtering apparatus comprising a backing plate to which a target is held facing a substrate to be processed, and a magnet disposed on a back side of the target relative to the substrate, and adapted to confine plasma on a target surface by forming a magnetic field on the target surface using the magnet, wherein:

the magnet comprises a rotary magnet group having a plurality of plate-like magnets arranged on a columnar rotary shaft and a fixed outer circumferential frame magnet which is arranged in parallel with the target surface around the rotary magnet group and which is magnetized in a direction perpendicular to the target surface;

a magnetic field pattern on the target surface moves with time by rotating the rotary magnet group along with the columnar rotary shaft;

the magnetron sputtering apparatus comprises a shielding member disposed on an opposite side of the target with respect to the rotary magnet group so as to cover an end portion of the target and to be spaced apart from the target, the shielding member being electrically grounded, and the shielding member extends in a direction the same as an axial direction of the columnar rotary shaft and forms a slit opening the target to the substrate; and the substrate is placed on a substrate placing stage and, while plasma is excited on the target surface by applying a DC power, a RF power, or a DC power and a RF power simultaneously to the target, a distance between the substrate or the substrate placing stage and the shielding member is shorter than a sheath thickness of the plasma at a position of the shielding member.

According to a second aspect of this invention, there is provided a magnetron sputtering apparatus comprising a backing plate to which a target is held facing a substrate to be processed, and a magnet disposed on a back side of the target relative to the substrate, and adapted to confine plasma on a target surface by forming a magnetic field on the target surface using the magnet, wherein:

the magnet comprises a rotary magnet group having a plurality of plate-like magnets arranged on a columnar rotary shaft and a fixed outer circumferential frame magnet which is arranged in parallel with the target surface around the rotary magnet group and which is magnetized in a direction perpendicular to the target surface;

a magnetic field pattern on the target surface moves with time by rotating the rotary magnet group along with the columnar rotary shaft;

the magnetron sputtering apparatus comprises a shielding member disposed on an opposite side of the target with respect to the rotary magnet group so as to cover an end portion of the target and to be spaced apart from the target, the shielding member being electrically grounded, and the shielding member extends in a direction the same as an axial direction of the columnar rotary shaft and forms a slit opening the target to the substrate; and the substrate is placed on a substrate placing stage and, while plasma is excited on the target surface by applying a DC power, a RF power, or a DC power and a RF power simultaneously to the target, a distance between the substrate or the substrate placing stage and the shielding member is shorter than a mean free path of electrons in the plasma at a position of the shielding member.

According to a third aspect of this invention, there is provided a magnetron sputtering apparatus comprising a backing plate to which a target is held facing a substrate to be processed, and a magnet disposed on a back side of the target relative to the substrate, and adapted to confine plasma on a target surface by forming a magnetic field on the target surface using the magnet, wherein:

the magnet comprises a rotary magnet group having a plurality of plate-like magnets arranged on a columnar rotary shaft and a fixed outer circumferential frame magnet which is arranged in parallel with the target surface around the rotary magnet group and which is magnetized in a direction perpendicular to the target surface;

a magnetic field pattern on the target surface moves with time by rotating the rotary magnet group along with the columnar rotary shaft;

the magnetron sputtering apparatus comprises a shielding member disposed on a side opposite to the rotary magnet group so as to cover an end portion of the target and to be spaced apart from the target, the shielding member being electrically grounded, and the shielding member extends in a direction the same as an axial direction of the columnar rotary shaft and forms a slit opening the target to the substrate; and the substrate is placed on a substrate placing stage and, while plasma is excited on the target surface by applying a DC power, a RF power, or a DC power and a RF power simultaneously to the target, a distance between the substrate and the shielding member is shorter than a mean free path of electrons in the plasma at a position of the shielding member and, upon plasma ignition or extinction, a distance between the substrate or the substrate placing stage and the shielding member is shorter than a mean free path of electrons at a position of the shielding member and a distance between the substrate and the shielding member at their portions closest to each other as seen in a vertical direction is longer than the mean free path of electrons at the position of the shielding member.

According to a fourth aspect of this invention, there is provided a magnetron sputtering apparatus comprising, in a process chamber, a backing plate to which a target is held facing a substrate to be processed and further comprising a magnet disposed on a back side of the target relative to the substrate, and adapted to confine plasma on a target surface by forming a magnetic field on the target surface using the magnet, wherein:

the magnet comprises a rotary magnet group having a plurality of plate-like magnets arranged on a columnar rotary shaft and a fixed outer circumferential frame magnet which is arranged in parallel with the target surface around the rotary magnet group and which is magnetized in a direction perpendicular to the target surface;

a magnetic field pattern on the target surface moves with time by rotating the rotary magnet group along with the columnar rotary shaft;

the magnetron sputtering apparatus comprises a shielding member disposed on an opposite side of the target with respect to the rotary magnet group so as to cover an end portion of the target and to be spaced apart from the target, and the shielding member extends in a direction the same as an axial direction of the columnar rotary shaft and forms a slit opening the target to the substrate; and the shielding member can be set to either of a first state electrically grounded to the process chamber and a second state electrically insulated from the process chamber and the target and, in the second state, plasma can be excited using the shielding member as an electrode by applying a RF power, a DC power, or a RF power and a DC power to the shielding member.

According to a fifth aspect of this invention, there is provided a magnetron sputtering apparatus comprising, in a process chamber, a backing plate to which a target is held facing a substrate to be processed and further comprising a magnet disposed on a back side of the target relative to the substrate, and adapted to confine plasma on a target surface by forming a magnetic field on the target surface using the magnet, wherein:

the magnet comprises a rotary magnet group having a plurality of plate-like magnets arranged on a columnar rotary shaft and a fixed outer circumferential frame magnet which is arranged in parallel with the target surface around the rotary magnet group so as to be parallel to the target surface and which is magnetized in a direction perpendicular to the target surface;

a magnetic field pattern on the target surface moves with time by rotating the rotary magnet group along with the columnar rotary shaft, the magnetron sputtering apparatus comprises a shielding member disposed on an opposite side of the target with respect to the rotary magnet group so as to cover an end portion of the target and to be spaced apart from the target, and the shielding member extends in a direction the same as an axial direction of the columnar rotary shaft and forms a slit opening the target to the substrate; and the shielding member has an inner portion being a conductor and a surface being an insulator and can be set to either of a first state where the conductor being the inner portion is electrically grounded to the process chamber and a second state where the conductor being the inner portion is electrically insulated from the process chamber and the target and, in the second state, magnetron plasma can be generated by applying a DC power to the conductor being the inner portion to form a current loop in the shielding member to thereby generate a magnetic field around the shielding member and, simultaneously, applying a RF power to the shielding member through a capacitor.

According to a sixth aspect of this invention, there is provided a magnetron sputtering apparatus according to the fourth or the fifth aspect, wherein, on a surface of the shielding member, at least a region where particles of the target are scattered to adhere when plasma is excited on the target surface is formed only by a curved surface or a flat surface.

According to a seventh aspect of this invention, there is provided a magnetron sputtering apparatus comprising, in a process chamber, a backing plate to which a target is held facing a substrate to be processed and further comprising a magnet disposed on a back side of the target relative to the substrate, and adapted to confine plasma on a target surface by forming a magnetic field on the target surface using the magnet, wherein:

the magnet comprises a rotary magnet group having a plurality of plate-like magnets arranged on a columnar rotary shaft and a fixed outer circumferential frame magnet which is arranged in parallel with the target surface around the rotary magnet group and which is magnetized in a direction perpendicular to the target surface;

a magnetic field pattern on the target surface moves with time by rotating the rotary magnet group along with the columnar rotary shaft;

the magnetron sputtering apparatus comprises a shielding member disposed on an opposite side of the target with respect to the rotary magnet group so as to cover an end portion of the target and to be spaced apart from the target, and the shielding member extends in a direction the same as an axial direction of the columnar rotary shaft and forms a slit opening the target to the substrate; and at least a region, on a surface of the shielding member, where particles of the target are scattered to adhere when plasma is excited on the target surface is formed only by a curved surface or a flat surface.

According to an eighth aspect of this invention, there is provided a magnetron sputtering apparatus comprising, in a process chamber, a backing plate to which a target is held facing a substrate to be processed and further comprising a magnet disposed on a back side of the target relative to to the substrate, and adapted to confine plasma on a target surface by forming a magnetic field on the target surface using the magnet, wherein:

the magnet comprises a rotary magnet group having a plurality of plate-like magnets arranged on a columnar rotary shaft and a fixed outer circumferential frame magnet which is arranged in parallel with the target surface around the rotary magnet group and which is magnetized in a direction perpendicular to the target surface;

a magnetic field pattern on the target surface moves with time by rotating the rotary magnet group along with the columnar rotary shaft;

the magnetron sputtering apparatus comprises a shielding member disposed on an opposite side of the target with respect to the rotary magnet group so as to cover an end portion of the target and to be spaced apart from the target, and the shielding member extends in a direction the same as an axial direction of the columnar rotary shaft and forms a slit opening the target to the substrate; and a plate-like member formed only by a curved surface or a flat surface is detachably provided in at least a region, on a surface of the shielding member, where particles of the target are scattered to adhere when plasma is excited on the target surface.

According to a ninth aspect of this invention, there is provided a magnetron sputtering apparatus according to the eighth aspect, wherein the plate-like member has one end portion having a curved surface shape and another end portion detachably provided on the shielding member.

According to a tenth aspect of this invention, there is provided a magnetron sputtering apparatus according to any one of the first to the ninth aspects, wherein the rotary magnet group is helical plate-like magnet groups forming a plurality of helices by helically disposing the plate-like magnets on the columnar rotary shaft such that the helices adjacent to each other in the axial direction of the columnar rotary shaft form mutually different magnetic poles of N-poles and S-poles on an outer side in a diameter direction of the columnar rotary shaft, and the fixed outer circumferential frame magnet is, as seen from a target side, configured to surround the rotary magnet group and forms a magnetic pole of N-pole or S-pole on the target side.

According to an eleventh aspect of this invention, there is provided a magnetron sputtering apparatus according to any one of the first to the tenth aspects, wherein at least part of the columnar rotary shaft is a paramagnetic substance.

According to a twelfth aspect of this invention, there is provided a magnetron sputtering apparatus according to any one of the first to the eleventh aspects, wherein a fixed outer peripheral paramagnetic member is disposed adjacent to the fixed outer circumferential frame magnet on an opposite side of the fixed outer circumferential frame magnet relative to the target.

According to a thirteenth aspect of this invention, there is provided a magnetron sputtering apparatus according to any one of the first to the twelfth aspects, further comprising means for weakening magnetic flux directed toward an outer side of the target from the fixed outer circumferential frame magnet in comparison with magnetic flux directed toward an inner side of the target from the fixed outer circumferential frame magnet.

According to a fourteenth aspect of this invention, there is provided a magnetron sputtering apparatus according to the thirteenth aspect, wherein the means comprises a paramagnetic member arranged to continuously cover, among surfaces of the fixed outer circumferential frame magnet, the side surface on an outer side as seen from the target side and part of the surface on the target side.

According to a fifteenth aspect of this invention, there is provided a magnetron sputtering apparatus according to the thirteenth or the fourteenth aspect, wherein the means is configured by the fixed outer circumferential frame magnet such that, among surfaces of the fixed outer circumferential frame magnet, the surface on the target side is projected toward the inner side of the target.

According to a sixteenth aspect of this invention, there is provided a magnetron sputtering apparatus according to any one of the first to the fifteenth aspects, wherein the shielding member extends in the direction the same as the axial direction of the columnar rotary shaft and forms the slit opening the target to the substrate and a width and a length of the slit are set so that, when the rotary magnet group is rotated at a constant frequency, a region is opened as seen from the substrate, such that a magnetic field strength is 75% or more of a maximum value in a time average distribution of magnetic field strengths of components parallel to the target surface in a magnetic field formed on the target surface.

According to a seventeenth aspect of this invention, there is provided a magnetron sputtering apparatus according to any one of the first to the fifteenth aspects, wherein the shielding member extends in the direction the same as the axial direction of the columnar rotary shaft and forms therealong the slit opening the target to the substrate and a width and a length of the slit are set so that, when the substrate is fixed and the plate-like magnet group is rotated at a constant frequency, a region of the substrate is shielded such that a film thickness to be formed per unit time is 80% or less of a maximum film thickness to be formed on the substrate per unit time when an end portion of the target is not shielded.

According to an eighteenth aspect of this invention, there is provided a magnetron sputtering apparatus according to any one of the first to the seventeenth aspects, wherein the rotary magnet group and the fixed outer circumferential frame magnet are movable in the direction perpendicular to the target surface.

According to a nineteenth aspect of this invention, there is provided a magnetron sputtering apparatus according to any one of the first to the eighteenth aspects, wherein the rotary magnet group and the fixed outer circumferential frame magnet are disposed in a space surrounded by the target member, a backing plate to which the target member is bonded, and a wall surface continuously extended from the periphery of the backing plate and the space can be reduced in pressure.

According to a twentieth aspect of this invention, there is provided a magnetron sputtering apparatus according to the nineteenth aspect, wherein the backing plate has a thickness smaller than an initial thickness of the target.

According to a twenty-first aspect of this invention, there is provided a magnetron sputtering apparatus according to any one of the first to the twentieth aspects, comprising means for relatively moving the substrate in a direction crossing the axial direction of the columnar rotary shaft.

According to a twenty-second aspect of this invention, there is provided a magnetron sputtering apparatus comprising a plurality of magnetron sputtering apparatuses each of which is formed in accordance with any one of the first to the twenty-first aspects and which are disposed in parallel with the axial direction of the columnar rotary shaft, wherein there is provided means for relatively moving the substrate in a direction crossing the axial direction of the columnar rotary shaft.

According to a twenty-third aspect of this invention, there is provided a sputtering method which uses a magnetron sputtering apparatus according to any one of the first to the twenty-second aspects and which performs film deposition of a material of the target on a substrate to be processed while rotating the columnar rotary shaft.

According to a twenty-fourth aspect of this invention, there is provided an electronic device manufacturing method comprising a step of performing sputtering film formation on a substrate to be processed, using the sputtering method according to the twenty-third aspect.

Further, according to this invention, there is obtained a method of manufacturing an electronic device (representing a semiconductor device, a flat display device, or another electronic device), comprising a step of performing sputtering film formation on a substrate to be processed, using the above-mentioned sputtering method.

Effect of the Invention

According to this invention, it is possible to improve the film forming rate and to prolong the life of a target by preventing local wear of the target to realize uniform consumption thereof and, simultaneously, it is possible to achieve film formation that does not cause charge-up damage.

Figure 1:
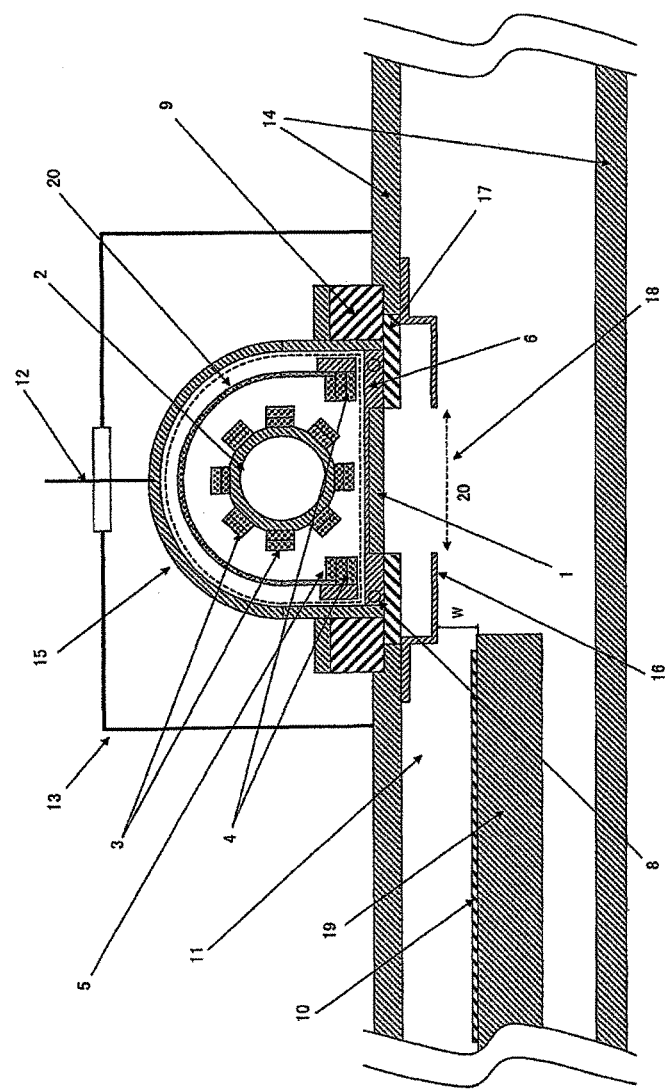
FIG. 1 is a schematic diagram showing a magnetron sputtering apparatus according to a first embodiment of this invention.

DESCRIPTION OF SYMBOLS 1 target
2 columnar rotary shaft
3 helical plate-like magnet group
4 fixed outer circumferential frame magnet
5 outer peripheral paramagnetic member
6 backing plate
8 coolant passage
9 insulating member
10 substrate to be processed
11 process chamber space
12 feeder line
13 cover
14 outer wall
15 paramagnetic member
16 plasma shielding member
16a plate member
17 insulating member
18 slit
19 placing stage for placing a substrate to be processed

BEST MODE FOR CARRYING OUT THE INVENTION

Hereinbelow, embodiments of this invention will be described with reference to the drawings.

First Embodiment

A first embodiment of this invention will be described in detail with reference to the drawings.

FIG. 1 is a sectional view for explaining the structure of a rotary magnet sputtering apparatus according to the first embodiment of this invention.

In FIG. 1, 1 denotes a target, 2 a columnar rotary shaft, 3 a plurality of helical plate-like magnet groups helically disposed on a surface of the rotary shaft 2, 4 a fixed outer circumferential frame magnet disposed at the outer periphery, 5 an outer peripheral paramagnetic member disposed on the side opposite to the target and faced to the fixed outer circumferential frame magnet 4, 6 a backing plate to which the target 1 is bonded and held, 15 a paramagnetic member configured to cover the columnar rotary shaft 2 and the helical plate-like magnet groups 3 at portions thereof other than on the target side, 8 a passage for passing a coolant therethrough, 9 an insulating member, 10 a substrate to be processed, 19 a placing stage for placing a substrate thereon, 11 a process chamber space, 12 a feeder line, 13 a cover electrically connected to a process chamber, 14 outer walls forming the process chamber, 16 a plasma shielding member disposed on the outer wall 14 so as to be electrically connected thereto, and 17 an insulating member excellent in plasma resistance.

A DC power supply, a RF power supply, and a matching device are connected to the feeder line 12. The plasma excitation power is supplied to the backing plate 6 and the target 1 from the DC power supply and the RF power supply through the matching device and further through the feeder line 12 and the housing so that plasma is excited on a target surface. Plasma can be excited only by the DC power or the RF power, but in terms of the film quality controllability and the film forming rate controllability, it is preferable to apply both. The frequency of the RF power is normally selected between several hundred kHz and several hundred MHz, but in terms of increasing the plasma density and reducing the plasma electron temperature, a high frequency is preferable. In this embodiment, it is set to 13.56 MHz. The shielding member 16 also functions as a ground plate for the RF power. With this ground plate, even if the processing substrate 10 is in an electrically floating state, plasma can be efficiently excited. The paramagnetic member 15 has an effect of magnetic shielding of a magnetic field generated by the magnets and an effect of reducing a change in magnetic field due to disturbance near the target.

Figure 2:
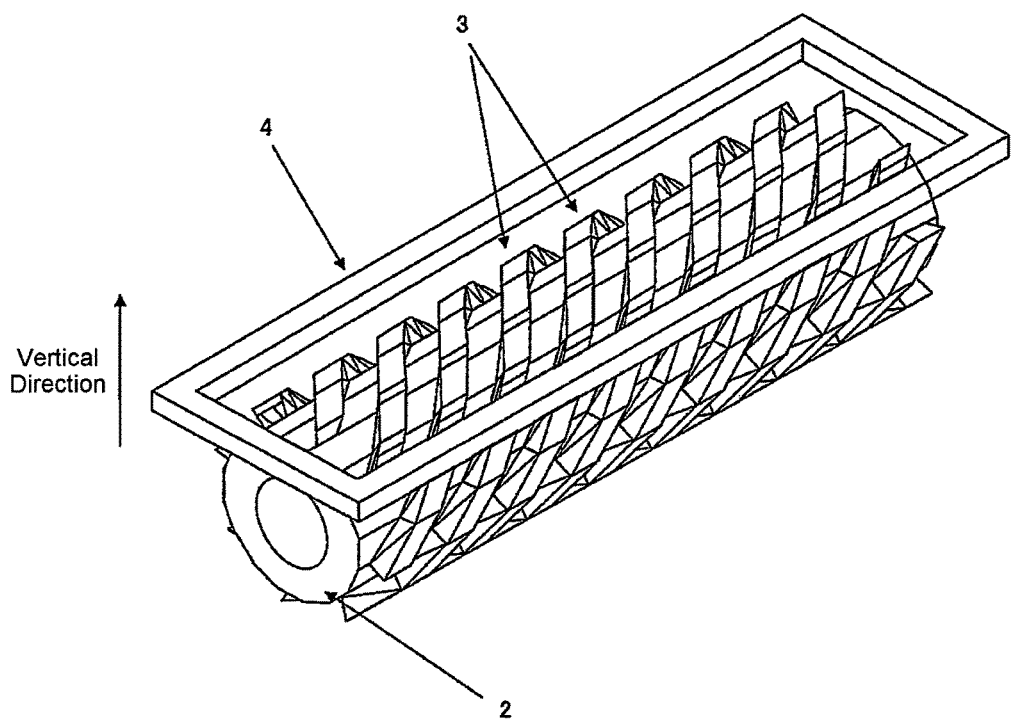
FIG. 2 is a perspective view showing a magnet portion of the magnetron sputtering apparatus shown in FIG. 1.

In order to explain a magnet portion in more detail, FIG. 2 shows a perspective view of the columnar rotary shaft 2, the plurality of helical plate-like magnet groups 3, and the fixed outer circumferential frame magnet 4. Herein, the plurality of helical plate-like magnet groups 3 form a rotary magnet group that rotates along with the rotation of the columnar rotary shaft 2.

A material of the columnar rotary shaft 2 may be an ordinary stainless steel or the like, but it is preferable that the columnar rotary shaft 2 be partly or entirely made of a paramagnetic substance with a low magnetic resistance such as, for example, a Ni—Fe-based high magnetic permeability alloy. In this embodiment, the columnar rotary shaft 2 is made of the Ni—Fe-based high magnetic permeability alloy. The columnar rotary shaft 2 can be rotated by a non-illustrated gear unit and motor.

The columnar rotary shaft 2 has a regular hexadecagonal cross-section with one side having a length of 16.7 mm. Many rhombic plate-like magnets are attached to respective faces to form the plurality of helical plate-like magnet groups 3. The columnar rotary shaft 2 is configured so as to be attached with the magnets on its outer periphery, can be easily made thick, and has a structure that is strong against bending due to magnetic forces applied by the magnets. In order to stably generate a strong magnetic field, each of the plate-like magnets forming the helical plate-like magnet groups 3 is preferably a magnet with a high residual magnetic flux density, a high coercive force, and a high energy product, such as, for example, a Sm—Co-based sintered magnet with a residual magnetic flux density of about 1.1 T or a Nd—Fe—B-based sintered magnet with a residual magnetic flux density of about 1.3 T. In this embodiment, the Nd—Fe—B-based sintered magnet is used. The plate-like magnets of the helical plate-like magnet groups 3 are each magnetized in a direction perpendicular to its plate surface and are helically bonded to the columnar rotary shaft 2 to form a plurality of helices such that the helices adjacent to each other in an axial direction of the columnar rotary shaft form mutually different magnetic poles, i.e. N-poles and S-poles, on the outer side in a diameter direction of the columnar rotary shaft.

The fixed outer circumferential frame magnet 4 is, as seen from the target 1, configured to surround the rotary magnet group composed of the helical plate-like magnet groups 3 and is magnetized so that the target 2 side becomes an S-pole. A Nd—Fe—B-based sintered magnet is also used as the fixed outer circumferential frame magnet 4 for the same reason as for the plate-like magnets of the helical plate-like magnet groups 3.

Figure 3:
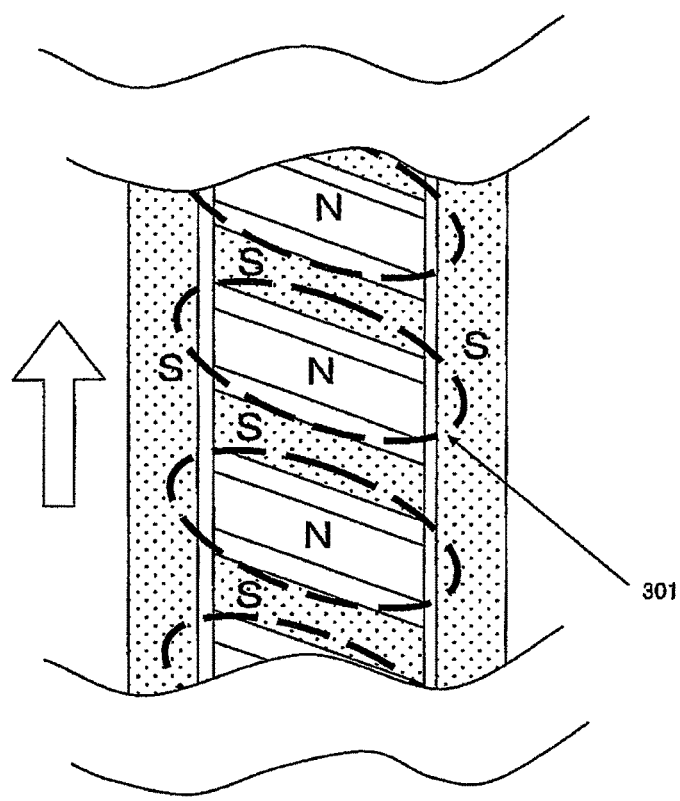
FIG. 3 is a diagram for conceptually explaining an arrangement of magnetic poles when helical plate-like magnet groups are seen from the target side, wherein S-poles are illustrated in dots.

Next, description will be made in detail with reference to FIG. 3 about erosion formation in this embodiment. Thus, the helical plate-like magnet groups 3 are formed by disposing the many plate-like magnets on the columnar rotary shaft 2, as mentioned before. When the helical plate-like magnet groups 3 are seen from the target side, an arrangement is given such that S-poles of the plate-like magnet approximately surround an N-pole of each of the other plate-like magnet. FIG. 3 is a conceptual diagram thereof. With this configuration, the lines of magnetic force generated from the N-poles of the plate-like magnets 3 are terminated at the peripheral S-poles. As a result, many closed erosion regions 301 are formed on the target surface located at some distance from surfaces of the plate-like magnets. Further, by rotating the columnar rotary shaft 2, the many erosion regions 301 move along with the rotation. In FIG. 3, the erosion regions 301 move in a direction indicated by an arrow. At end portions of the rotary magnet group 3, the erosion regions 301 are sequentially generated from one of the end portions and sequentially extinguished at the other end portion.

In this embodiment, the columnar rotary shaft 2 has the regular octagonal cross-section and the plate-like magnets are bonded to the respective faces. However, it may be configured that, in order to realize a smoother helical shape, the shape of the cross-section is set to a regular polygon with more vertices and smaller plate-like magnets are bonded thereto or, in order to cause adjacent plate-like magnets, which form helices, to approximate each other, the shape of a cross-section of each plate-like magnet is set not to a rectangle but to a trapezoid with a larger outer side in the diameter direction of the rotary shaft.

Next, using FIG. 4, description will be given about an effect obtained by forming the columnar rotary shaft 2 of the paramagnetic substance.

Figure 4:
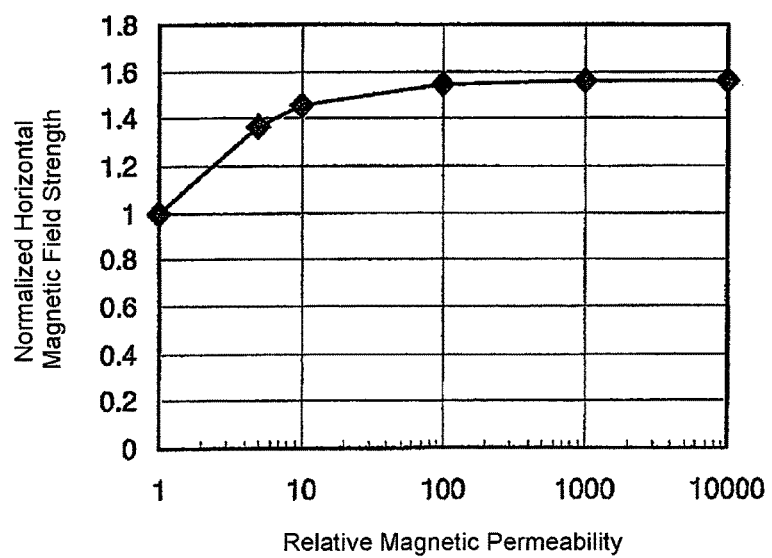
FIG. 4 is a graph showing the relationship between the horizontal magnetic field strength of an erosion region and the relative magnetic permeability of a columnar rotary shaft.

In FIG. 4, the ordinate axis and the abscissa axis represent the horizontal magnetic field strength of the erosion region 301 and the relative magnetic permeability of the columnar rotary shaft 2, respectively, thereby showing the dependence of the horizontal magnetic field strength upon the relative magnetic permeability of the columnar rotary shaft 2. In FIG. 4, normalization is performed when the relative magnetic permeability is 1. From FIG. 4, it is seen that as the relative magnetic permeability of the columnar rotary shaft 2 increases, the horizontal magnetic field strength also increases and, in particular, when the relative magnetic permeability is 100 or more, a magnetic field strength increase of about 60% could be obtained. This is because the magnetic resistances on the columnar rotary shaft side of the plate-like magnets forming the helices are reduced so that the lines of magnetic force can be efficiently generated toward the target side. This makes it possible to improve the confining effect when plasma is excited, so that the plasma electron temperature decreases to reduce the damage to the substrate and further the plasma density increases to improve the film forming rate.

Figure 5:
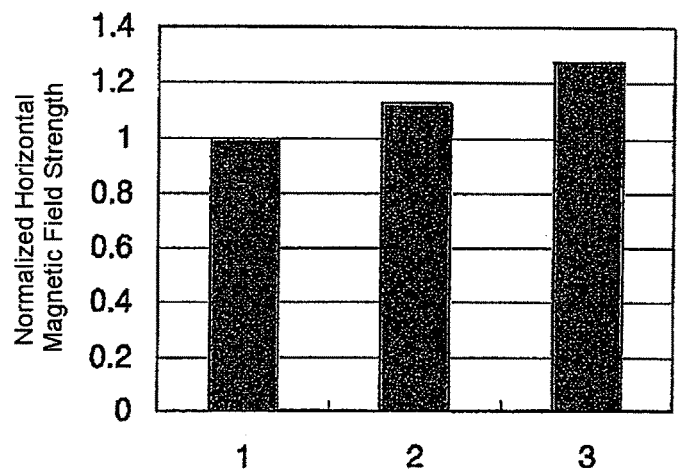
FIG. 5 is a graph for explaining a comparison between horizontal magnetic field strengths when a fixed outer peripheral paramagnetic member is provided and when it is not provided.

Further, as shown in FIG. 5, it is seen that when the fixed outer peripheral paramagnetic member is provided under the fixed outer circumferential frame magnet 4, the horizontal magnetic field strength increases by about 10% as compared with the case where it is not provided and, further, when part of the fixed outer peripheral paramagnetic member is extended to a portion adjacent to the columnar rotary shaft 2 and is adjoined to a magnetic body portion of the columnar rotary shaft 2 through a magnetic fluid to form a magnetic circuit with a low magnetic resistance between the rotary magnet group and the fixed outer circumferential frame magnet, the horizontal magnetic field strength increases by about 30%, so that the film forming performance is improved.

Figure 6:
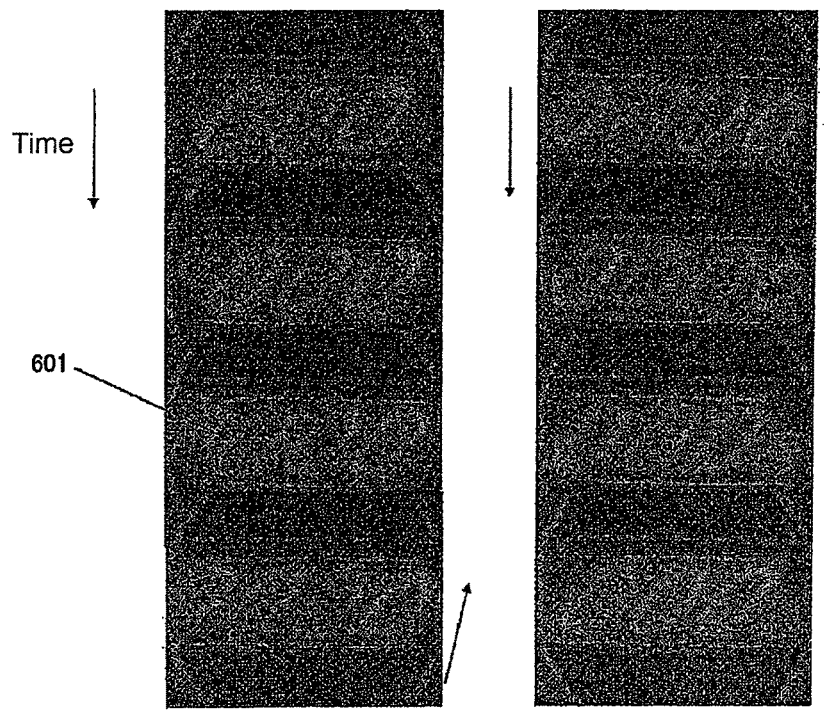
FIG. 6 is a diagram for explaining time-dependent changes of plasma on a target surface.
Figure 7:
FIG. 7 is a diagram showing a consumption state of a target after long-term discharge.

In this embodiment, it is seen that the horizontal magnetic field strength of the erosion region 301, i.e. the magnetic field strength parallel to the target surface, exceeds 500 gauss and thus there is obtained a strength sufficient for confining plasma. FIG. 6 shows photographs of time-dependent changes of plasma on the target surface. Plasma excitation conditions were such that an argon gas was introduced at 1000 cc per minute and a 13.56 MHz RF power of 800 W was applied. The columnar rotary shaft was rotated at 1 Hz. As seen from the photograph (showing a state of changes with time from upper to lower) on the left side of FIG. 6, a plasma loop 601 (erosion loop) is stably produced from the left end of the rotary shaft, then moves along with the rotation, and, as seen from the photograph (showing a state of changes with time from upper to lower) on the right side of FIG. 6, is stably extinguished from the right end of the rotary shaft. FIG. 7 shows a photograph of a consumption state of the target after long-term discharge. From the figure, it is seen that the target surface is consumed not locally but uniformly.

In this embodiment, on the side of the target 1 opposite to the helical plate-like magnet groups 3, i.e. on the side of the target 1 where the processing substrate is disposed, a member extending opposingly in a direction the same as the axial direction of the helical plate-like magnet groups, opened, and electrically grounded, i.e. the plasma shielding member 16 (FIG. 1), is connected to and provided on the process chamber wall 14 so as to cover end portions of the target 1 and to be spaced apart from the target 1, thereby forming a slit 18 exposing the target 1. That is, the slit 18 is formed by the grounded plasma shielding member 16.

As shown in FIG. 1, the processing substrate 10 is retreated from right under the slit 18 when plasma is ignited or extinguished and, after the ignition of the plasma, the placing stage 19 is moved to continuously move the substrate to the slit opening portion, i.e. a film forming region, thereby carrying out film formation. In this event, reciprocation may be performed a plurality of times for increasing the thickness of a film to be formed. However, the substrate is retreated from the slit 18 at a moment when plasma is ignited or extinguished.

Further, in the illustrated example, the distance W between the placing stage 19 and the plasma shielding member 16 is set shorter than the mean free path of plasma electrons. Therefore, uncontrolled electrons produced by arcing or abnormal discharge generated in a transient state upon plasma ignition or extinction cannot reach the substrate. On the other hand, if the distance W is longer than the electron mean free path, much plasma reaches the substrate 10. The electron mean free path $\lambda$en is given by $\lambda$en=0.4/P in an argon gas atmosphere. Herein, the unit of $\lambda$en is mm and P is an argon pressure expressed in unit of Torr. Since the argon pressure was set to 5 mTorr in the film formation, the mean free path was 8 mm.

Figure 8:
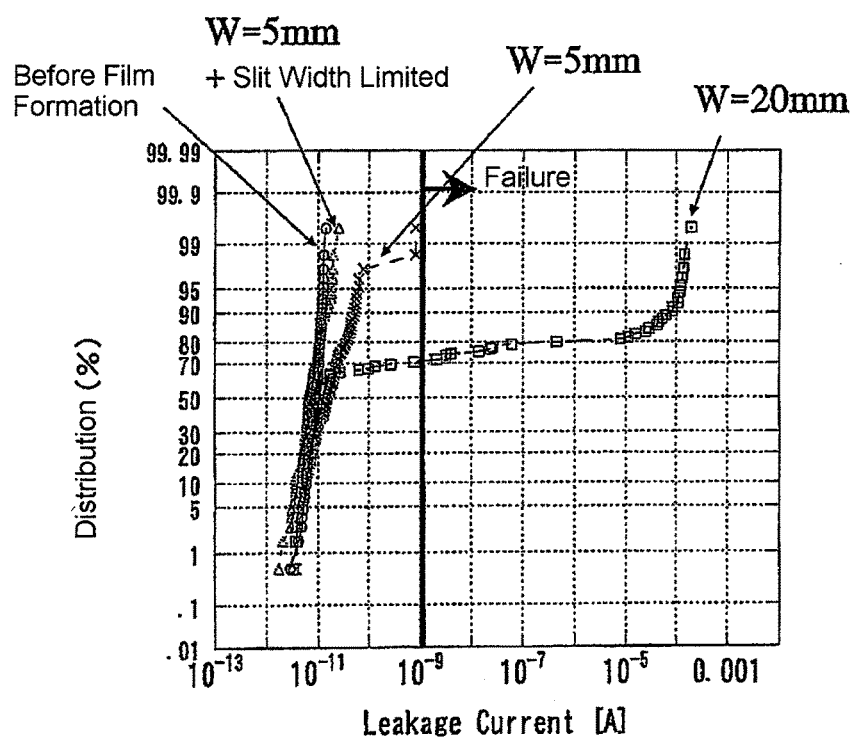
FIG. 8 is a graph showing the relationship between the width of a slit formed by a plasma shielding member and the charge-up damage.

FIG. 8 shows the charge-up damage evaluation results at thermal oxide film antenna MOS capacitors (oxide film thickness 4 nm) formed in large number on a wafer having a diameter of 200 mm. Antennas are connected to the MOS capacitors, respectively. The figure shows normal plots of leakage current when the antenna ratio (ratio of antenna area to active region area) is 1000000 and 5V is applied to the gate. When $10^{-9}$ A or more flows, it is defined as failure.

From FIG. 8, it is seen that when W=20 mm, electrons produced upon plasma ignition or extinction reach and charge the wafer so that failure occurs at nearly 30%. On the other hand, when W=5 mm, there is no antenna MOS capacitor judged as failure. From this, it is seen that the charge-up damage to the processing substrate can be significantly reduced by setting W to be shorter than the mean free path.

In this embodiment, W is set equal to or less than the electron mean free path. However, in order to make the plasma shielding more reliable, it is more preferable that this distance be set equal to or less than the sheath thickness of plasma near the plasma shielding member 16 (normally, the sheath thickness is smaller than the mean free path). Specifically, since the plasma density, the electron temperature, and the sheath voltage at the plasma shielding member 16 are $10^{10}$ cm$^{-3}$, 2 eV, and about 12V, respectively, W=0.4 mm is set in this case.

On the other hand, the horizontal magnetic field strength on the target 1 surface increases as the backing plate 6 decreases in thickness, because the target surface approaches closer to the magnets. If the horizontal magnetic field strength increases, plasma confinement is improved so that a higher film forming rate is achieved and the plasma excitation efficiency is improved. Therefore, a further improvement in film forming rate is achieved by enabling a space in which the rotary magnet group is disposed, to be reduced in pressure and setting the thickness of the backing plate 6 to be smaller than the initial thickness of the target.

Further, since the target 1 is uniformly consumed, by moving the magnets in a vertical direction along with the consumption of the target 1, the horizontal magnetic field with an equal strength can be constantly formed at every position on the target surface with excellent reproducibility so that the film formation reproducibility in long-term continuous operation is improved.

Second Embodiment

Figure 9:
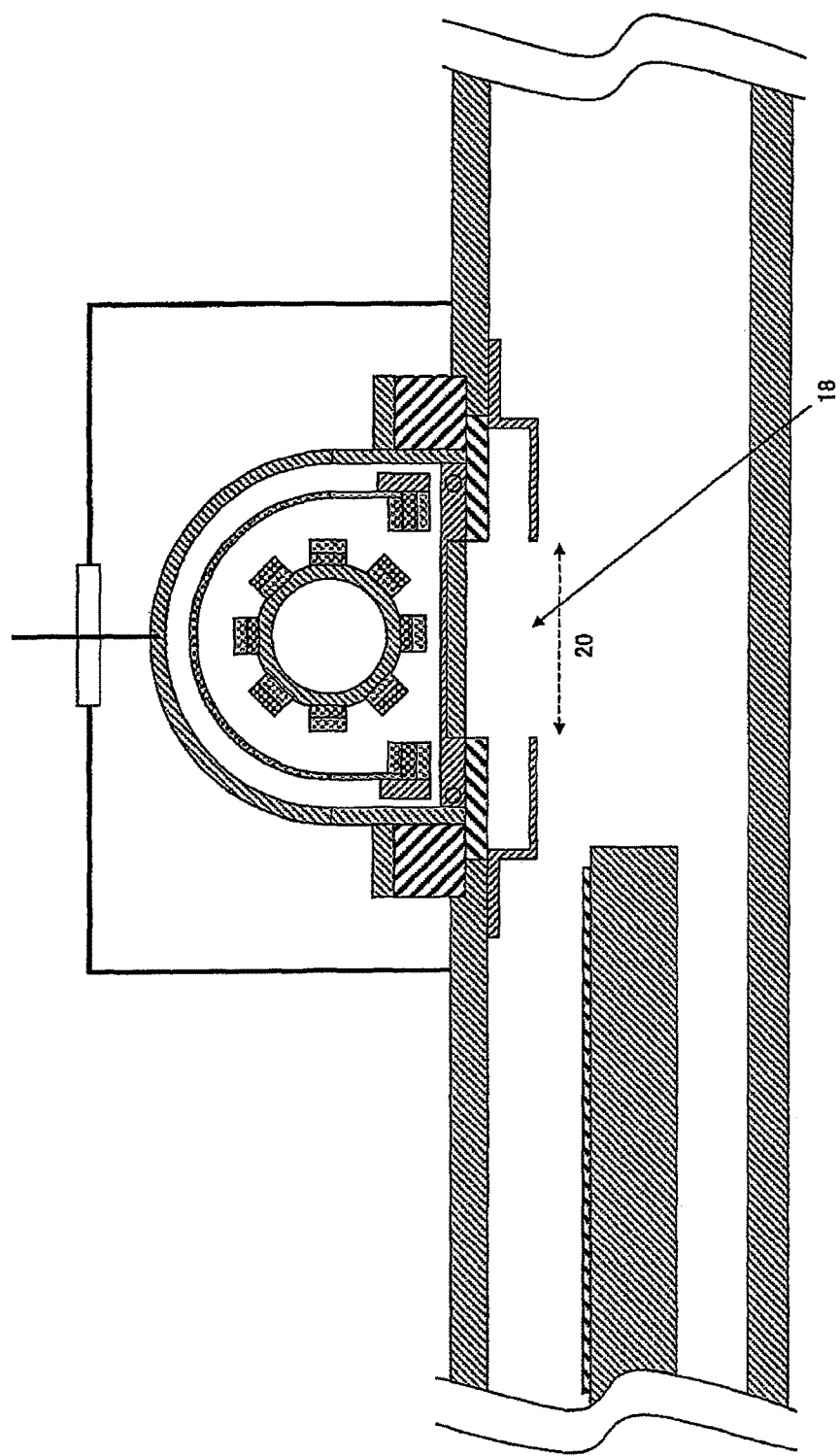
FIG. 9 is a schematic diagram showing a magnetron sputtering apparatus according to a second embodiment of this invention.

A second embodiment of this invention will be described in detail with reference to the following drawings. A description of portions overlapping those in the above-mentioned embodiment is omitted for brevity of description. In this embodiment shown in FIG. 9, the slit width 20 and the length of a slit 18 are set so that when a substrate to be processed is fixed and helical plate-like magnet groups are rotated at a constant frequency, a region of the substrate is shielded where the film thickness to be formed per unit time is 80% or less of the maximum film thickness to be formed on the substrate per unit time when there is no slit. In this embodiment, a material of a target is pure aluminum. A description will be given in more detail using FIG. 10.

Figure 10:
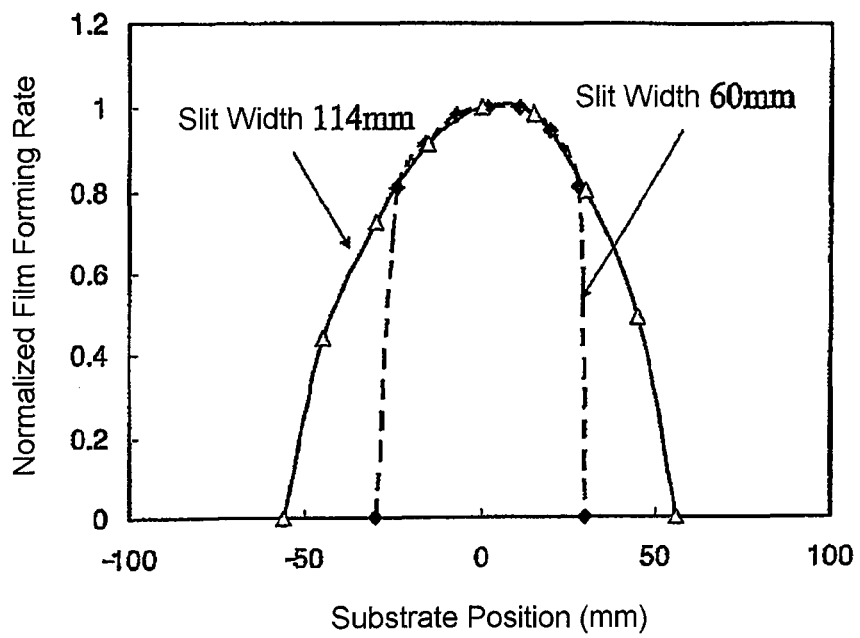
FIG. 10 is a graph showing the relationship between the slit width and the film forming rate.

FIG. 10 shows the film forming rate distribution in a direction perpendicular to an axis of a columnar rotary shaft when a silicon substrate is disposed at a position spaced apart from a target surface by 30 mm and faces the target surface. The figure shows the case where the slit width 20 is 114 mm and 60 mm, wherein normalization is performed by the center maximum film forming rate. A plasma shielding member (i.e. a ground plate) 16 forming the slit 18 is formed by a stainless plate having a thickness of 2 mm at a position spaced apart from the target 1 surface by 25 mm. Since the width of the target 1 is 102 mm, substantially all scattered particles of the target 1 reach the silicon substrate being the substrate 10 to be processed, without being shielded by the plasma shielding member 16 so as to be formed into a film when the slit width is 114 mm. On the other hand, when the slit width is 60 mm, the plasma shielding member 16 shields a portion where the film forming rate is 80% or less of the maximum film forming rate.

Figure 11:
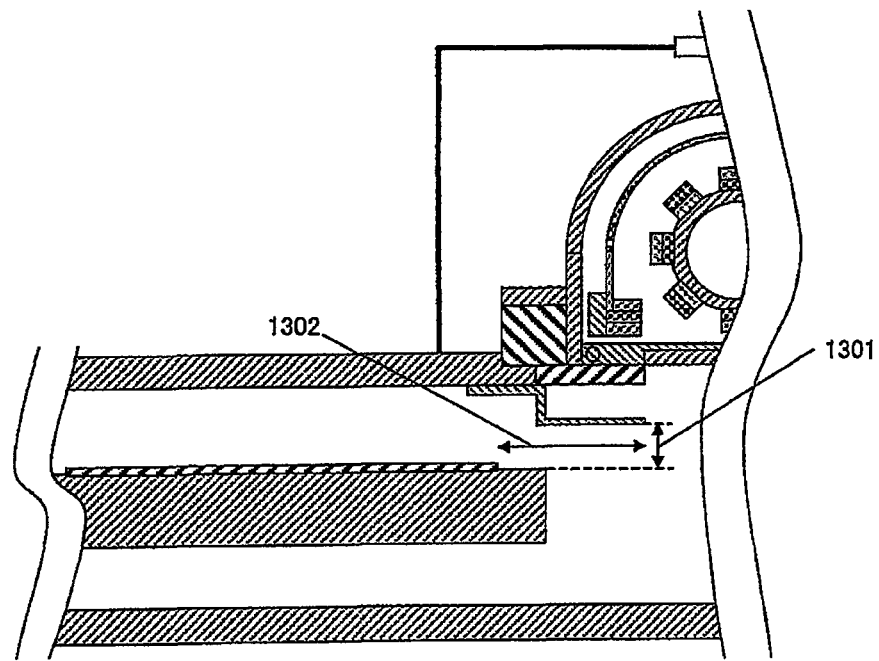
FIG. 11 is a diagram for more specifically explaining the distance between a substrate to be processed and a shielding member.

Referring also to FIG. 11, 1301 represents the vertical distance between a processing substrate placing stage and the shielding member, wherein this distance is set shorter than the electron mean free path at the position of the shielding member. On the other hand, 1302 represents the horizontal distance between the substrate and the shielding member at their portions closest to each other as seen in the vertical direction, wherein this distance is set longer than the electron mean free path at the position of the shielding member. That is, the distance between the substrate at its retreated position and the shielding member is also set longer than the electron mean free path at the position of the shielding member. With this setting, electrons do not reach the substrate upon plasma ignition or plasma extinction and, since the mean free path of ions such as argon ions larger than electrons is shorter than the electron mean free path, those ions do not reach the substrate. This makes it possible to prevent the charge-up damage.

Figure 12:
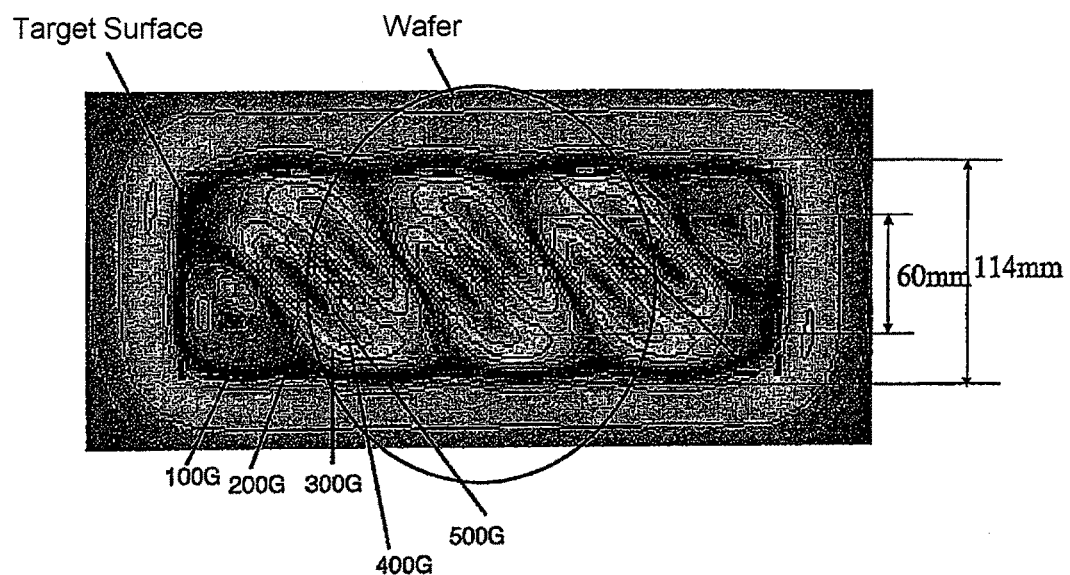
FIG. 12 is a contour diagram showing the horizontal magnetic field distribution on a target surface.

FIG. 12 shows a contour diagram of the horizontal magnetic field distribution on the target surface. This is the case where the columnar rotary shaft is at a certain phase. When the time average is obtained with respect to substantially all phases, the maximum average horizontal magnetic field strength is 392 G and, by setting the slit width to 60 mm, a region, as seen from the substrate, is shielded where the average horizontal magnetic field strength is 295 G, being 75% of the maximum average horizontal magnetic field strength, or less. By setting the slit width to 60 mm, in film formation on the substrate, aluminum atoms are immediately formed into a metal film simultaneously with irradiation with plasma and thus it is possible to prevent charge-up of the substrate. This makes it possible to prevent the charge-up damage. A description will be given in more detail using FIG. 8. In FIG. 8, W is set equal to or less than the electron mean free path and further the slit width is set to 60 mm. With respect to the antenna MOSs with an antenna ratio of 1000000, not only the failure rate is 0 percent, but also there is shown nearly the same leakage current as that before the film formation. This means that if applied to a metal film forming process for producing MOS transistors or the like, a dramatic reduction in variation among threshold voltages or in low-frequency noise is realized.

Third Embodiment

Figure 13:
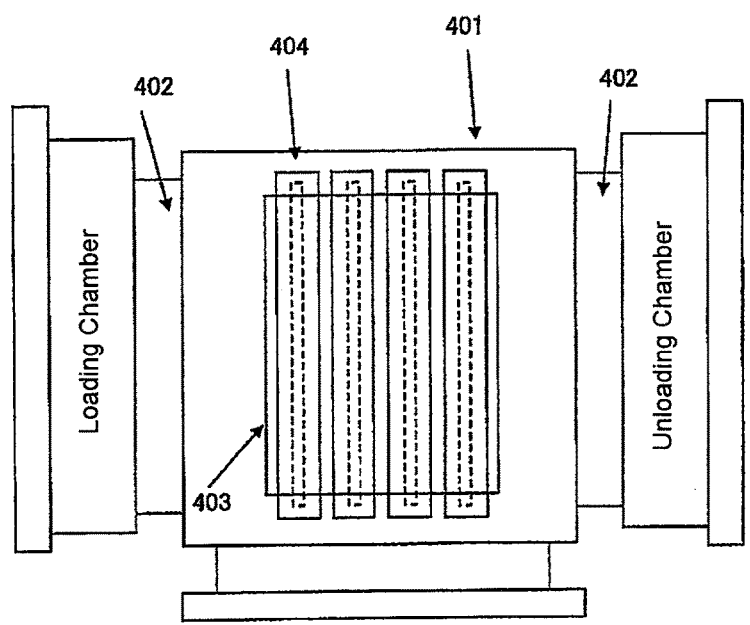
FIG. 13 is a schematic diagram showing a magnetron sputtering apparatus according to a third embodiment of this invention.

A third embodiment of this invention will be described in detail with reference to the following drawings. A description of portions overlapping those in the above-mentioned embodiments is omitted for simplification of description. As shown in FIG. 13, a rotary magnet sputtering apparatus according to this invention is particularly suitable when it is used as a reciprocating type film forming apparatus.

In FIG. 13, 401 denotes a process chamber, 402 a gate valve, 403 a processing substrate, and 404 the rotary magnet plasma excitation portion shown in the third embodiment. Although the axial length of the helical portion is 307 mm in the first embodiment, it is 270 mm in this embodiment. The frequency of the plasma excitation power is set to 13.56 MHz. In terms of increasing the plasma density and reducing the plasma electron temperature, a high frequency, for example, about 100 MHz is preferable. However, the plasma excitation portion is about 2.7 m while the wavelength of 100 MHz is 3 m. If the length of the excitation portion approximates the wavelength as described above, there is a possibility that a standing wave is excited to make plasma nonuniform. If the frequency is 13.56 MHz, the wavelength is 22.1 m and thus the length of the plasma excitation portion is sufficiently shorter than the wavelength so that there is no possibility that plasma becomes nonuniform due to the influence of a standing wave.

Also in this example, the substrate is placed on the substrate placing stage and, while plasma is excited on the target surface by applying the DC power, the RF power, or the DC power and the RF power simultaneously to the target, the distance between the substrate or the substrate placing stage and the shielding member is set shorter than the mean free path of electrons in the plasma at the position of the shielding member.

In this embodiment, four rotary magnet plasma excitation portions 404 are used. This makes it possible to increase the substantial film forming rate. The number of excitation portions is not limited to four. The substrate 403 is a 2.2 m×2.5 m glass substrate. In this embodiment, the substrate is placed with 2.5 m in the length direction and it is configured that the substrate reciprocates in a direction perpendicular to the columnar rotary axis of the rotary magnet plasma excitation portion so that film formation is substantially uniformly enabled on the substrate. For uniform film formation, the substrate 403 may be set not to reciprocate but to pass in one direction or use may be made of a method of moving the rotary magnet plasma excitation portion 404. In this embodiment, by reciprocating the substrate, it is possible to continuously expose part of the substrate to a plasma region excited by the rotary magnet plasma excitation portion, thereby uniformly forming a thin film. By setting the rotational speed of the rotary magnets so that the time for one rotation is faster than the passing time of the substrate, it is possible to achieve uniform film formation not affected by moment-to-moment erosion patterns. Typically, the passing speed of the substrate is 60 seconds per substrate and the rotational speed of the rotary magnets is 10 Hz. Although the substrate is reciprocated in this embodiment, the apparatus may alternatively be formed as a passing film formation type apparatus in which a substrate is caused to pass through one or a plurality of rotary magnet plasma excitation portions only once.

Fourth Embodiment

A fourth embodiment of this invention will be described in detail with reference to the following drawings. A description of portions overlapping those in the above-mentioned embodiments is omitted for simplicity of description.

In this embodiment, the plasma shielding member 16 shown in FIG. 1 extends in the axial direction of the columnar rotary shaft 2 and has the slot 18 that opens the target 1 with respect to the substrate 10. In this example, the width and the length of the slit 18 are set so that when the rotary magnet group 3 is rotated at a constant frequency, a region where the magnetic field strength is 75% or more of the maximum value in the time average distribution of magnetic field strengths of components parallel to the target 1 surface in a magnetic field formed on the target 1 surface is opened as seen from the substrate 10. Simultaneously, the width and the length of the slit 18 are set so that a region of the substrate 10 is shielded where the film thickness to be formed per unit time is 80% or less of the maximum film thickness to be formed on the substrate 10 per unit time when the end portions of the target 1 are not shielded. A region not shielded by the plasma shielding member 16 (i.e. a region opened to the target 1 through the slit 18) is a region where the magnetic field strength is large and thus plasma with a high density and a low electron temperature is generated so that there is no charge-up damage or ion irradiation damage to the substrate, and is simultaneously a region where the film forming rate is high. By shielding the region other than this region by the plasma shielding member 16, film formation with no damage is enabled without substantially reducing the film forming rate.

The plasma shielding member 16 also functions as a ground plate for the RF power. With this ground plate, even if the substrate 10 is in an electrically floating state, plasma can be efficiently excited. The paramagnetic member 15 has an effect of magnetic shielding of a magnetic field generated by the magnets and an effect of reducing a change in magnetic field due to disturbance near the target.

Figure 14:
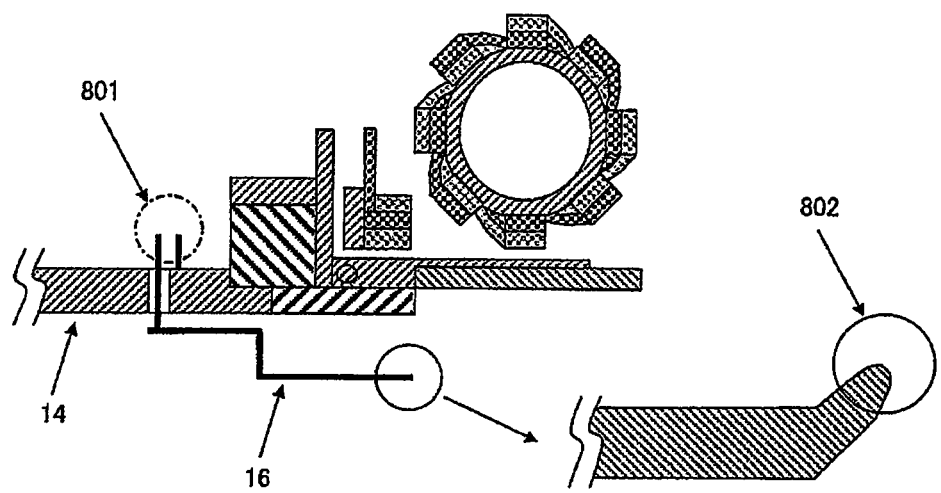
FIG. 14 is a diagram specifically showing the structure of a plasma shielding member in a magnetron sputtering apparatus according to a fourth embodiment of this invention.

Next, referring also to FIG. 14, the structure of the plasma shielding member 16 according to this embodiment will be described more specifically. As shown in FIG. 14, the plasma shielding member 16 and the outer wall 14 are respectively provided with terminals which form a terminal pair 801. By setting the terminal pair 801 of the plasma shielding member 16 and the outer wall 14 in an electrically connected state, the plasma shielding member 16 and the outer wall 14 can be electrically connected to each other. On the other hand, by setting the terminal pair 801 of the plasma shielding member 16 and the outer wall 14 in an electrically insulated state, the plasma shielding member 16 and the outer wall 14 are electrically insulated from each other.

During normal operation, i.e. when forming a thin film on the substrate 10 by a sputtering process, the plasma shielding member 16 is electrically connected to ground so as to function as a ground surface for the power applied to the target 1. For reducing the resistance to the outer wall 14 as much as possible, it is preferable to provide a plurality of terminal pairs 801 of the plasma shielding member 16 and the outer wall 14.

Herein, the reason for providing the terminals on the plasma shielding member 16 and the outer wall 14, respectively, to form the terminal pair 801 will be explained. When the illustrated magnetron sputtering apparatus is operated for a long term, a large amount of film adheres to the plasma shielding member 16 and the adhering film is separated. There arises a problem that the inside of the process chamber is contaminated with the separated film. Therefore, in this invention, in order to solve this problem, cleaning is carried out without opening the process chamber space 11 to the atmosphere at a stage where the film adheres to the plasma shielding member 16 to some degree.

In the illustrated example, when carrying out the cleaning, the plasma shielding member 16 and the outer wall 14 are set in an electrically insulated state. Then, an argon gas for exciting plasma is caused to flow in the process chamber space 11 and the power is applied to the plasma shielding member 16 by a non-illustrated RF power supply, thereby exciting plasma using the plasma shielding member 16 as an electrode. Since the plasma shielding member 16 is used as the electrode, only a low-density plasma reaches the target 1 and the ion irradiation energy is only about several tens of V so that the target 1 is not substantially consumed. On the other hand, since high-energy plasma ions are irradiated onto the surface of the shielding member 16 due to generation of a self-bias voltage of minus several hundreds of V, it is possible to clean up the adhering film. In this embodiment, the cleaning is carried out using only the RF power. However, the RF power and the DC power may be simultaneously applied for positively controlling the self-bias or plasma excitation may be carried out using only the DC power.

When carrying out the cleaning, the wavelength of light emission caused by the adhering particles (i.e. particles of the target material) is measured and the cleaning may be finished when the light emission disappears or becomes sufficiently weak. In this embodiment, since the magnets are rotated, the film uniformly adheres in the axial direction and thus it is possible to efficiently carry out the cleaning.

In this embodiment, the argon gas is used as a gas for exciting plasma. However, use may alternatively be made of a gas with reactivity and etchability to the adhering film.

A material of the plasma shielding member 16 is required to be a conductor such as stainless or aluminum, but the outermost surface is preferably formed with a strong protective film so as to prevent damage at the time of finishing the cleaning.

In this embodiment, an $Al_2O_3$ protective film is formed by selectively oxidizing, by about 100 nm, a surface of austenitic stainless containing 3% Al. The protective film is not limited thereto. For example, an $Al_2O_3$ protective film with a thickness of 0.5 μm may be formed by nonaqueous anodic oxidation at an Al surface containing 0.1% Zr and about 2% Mg or an $Al_2O_3$ or $Y_2O_3$ protective film may be formed by thermal spraying.

In the example shown in FIG. 14, as illustrated at 802 in an enlarged manner, a region of the plasma shielding member 16 where target particles are scattered to adhere when plasma is excited on the target 1 surface, i.e. at least a region, facing the target 1, of the plasma shielding member 16, is formed only by a curved surface or a flat surface. In other words, the plasma shielding member 16 near the slit does not have a steeple shape such as an angular shape or an acute angle shape. Since film separation at the plasma shielding member 16 during the long-term operation first starts to occur at a pointed portion, this structure employs a structure in which it is avoided and the film separation itself is hard to occur.

The horizontal magnetic field strength on the target 1 surface increases as the backing plate 6 decreases in thickness, because the target surface approaches closer to the magnets. If the horizontal magnetic field strength increases, plasma confinement is improved so that a higher film forming rate is achieved and the plasma excitation efficiency is improved. Therefore, a further improvement in film forming rate is achieved by enabling the space in which the rotary magnet group is disposed, shown in FIG. 1, to be reduced in pressure and setting the thickness of the backing plate 6 to be smaller than the initial thickness of the target.

Further, since the target 1 is uniformly consumed, by moving the magnets in a vertical direction along with the consumption of the target 1, the horizontal magnetic field with an equal strength can be constantly formed at every position on the target surface with excellent reproducibility so that the film formation reproducibility in long-term continuous operation is improved.

Accordingly, it becomes possible to stably perform the long-term film forming operation without opening the process chamber space to the atmosphere and without replacing the shielding member.

Fifth Embodiment

Figure 15:
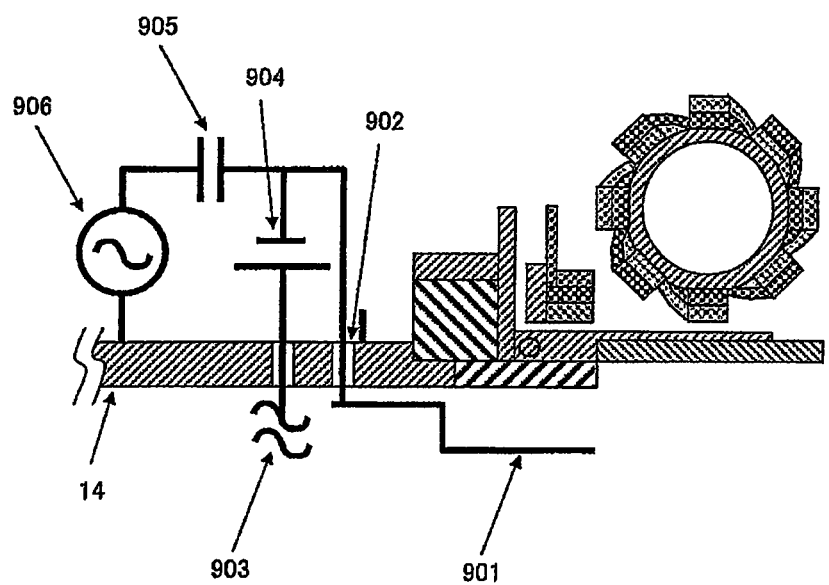
FIG. 15 is a diagram for explaining a plasma shielding member in a magnetron sputtering apparatus according to a fifth embodiment of this invention.
Figure 16:
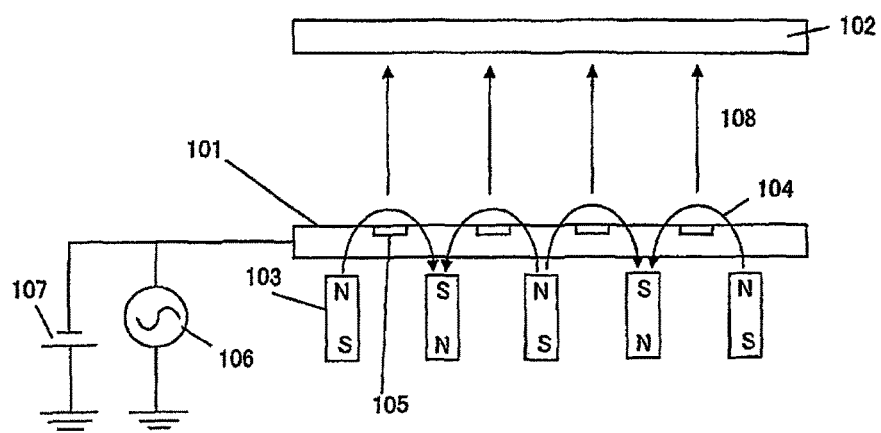
FIG. 16 is a schematic diagram for explaining a conventional magnetron sputtering apparatus.

A fifth embodiment of this invention will be described in detail with reference to the following drawings. A description of portions overlapping those in the above-mentioned embodiments is omitted for simplicity of description. FIG. 15 shows a rotary magnet sputtering apparatus according to this invention. A plasma shielding member 901 is made of copper with a low electrical resistance and is formed with a thermally sprayed film of $Y_2O_3$ at its surface. That is, the inner portion is a conductor and the outer portion is an insulator. The inner conductor is provided with a plurality of terminals and a DC power supply 904 is provided between the terminal 902 being one of the terminals and the terminal 903 being the other of the terminals so that a DC current loop can be formed in the plasma shielding portion 901. Simultaneously, this current loop is provided with a RF power supply 906 through a capacitor 905 so that the RF power can also be applied to the current loop.

By forming the current loop using the DC power supply 904, it is possible to generate a magnetic field around the plasma shielding member 901. Since the inner conductor of the illustrated plasma shielding member 901 is copper and thus the electrical resistance is low, the potential difference is hardly generated between the terminals 902 and 903. On the other hand, this current loop is provided with the RF power supply 906 through the capacitor 905. By applying the RF power to the inner conductor of the plasma shielding member 901 using this RF power supply, it is possible to excite plasma on the surface of the plasma shielding member 901. Since there is a plasma confining effect by the magnetic field, the cleaning time can be further shortened. Since the surface of the plasma shielding member 901 is the insulator, a plasma current is prevented from flowing into the current loop.

Sixth Embodiment

A sixth embodiment of this invention will be described in detail with reference to the following drawings. A description of portions overlapping those in the above-mentioned embodiments is omitted for simplicity of description. As shown in FIG. 13, a rotary magnet sputtering apparatus according to this invention is particularly suitable when it is used as a reciprocating type film forming apparatus.

According to this embodiment, in FIG. 13, it is configured that the shielding member and the outer wall can be electrically connected to or insulated from each other and, in the insulated state, the RF power can be applied to the surface of the shielding member to excite plasma, and therefore, it is possible to clean the shielding member without opening the inside of the process chamber to the atmosphere.

Seventh Embodiment

Figure 17:
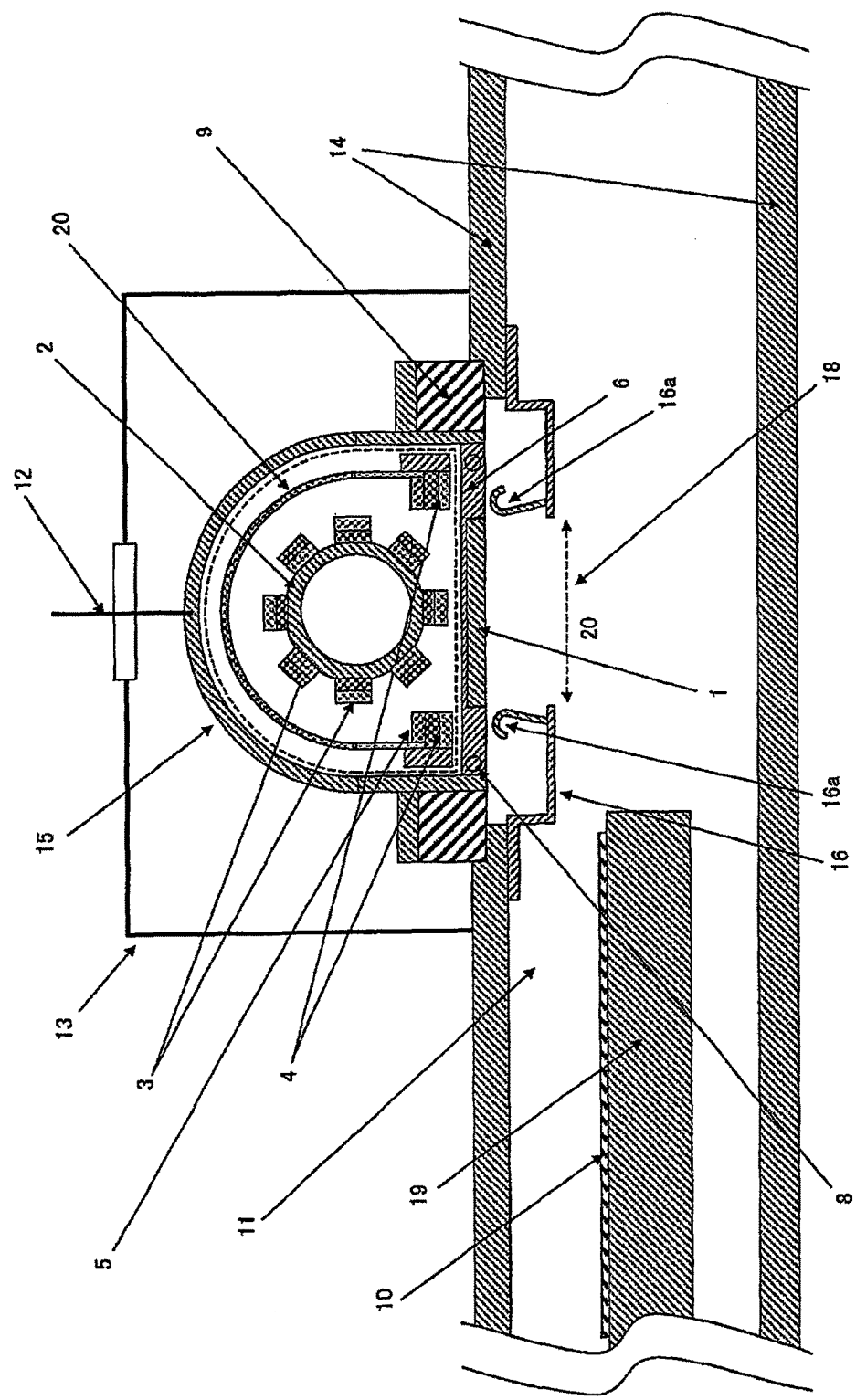
FIG. 17 is a schematic diagram showing a magnetron sputtering apparatus according to a seventh embodiment of this invention.

A seventh embodiment of this invention will be described in detail with reference to the following drawings. A description of portions overlapping those in the above-mentioned embodiments is omitted for simplicity of description. FIG. 17 shows a rotary magnet sputtering apparatus according to this invention.

In this embodiment, plate members, as denoted by 16a in FIG. 17, each having an end portion of a curved surface shape are attached to a plasma shielding member 16 on the inner side (target 1 side) thereof.

More specifically, each plate member 16a has one end portion having a curved surface shape and the other end portion detachably provided in a region of the plasma shielding member 16, where target particles are scattered to adhere.

The plate member 16a is made of, for example, stainless steel and a surface thereof on the target side may be satin-finished.

The plate member 16a is detachably attached to the plasma shielding member 16 and, after the lapse of a predetermined time, the plate member 16a is detached, subjected to cleaning of adhering matter on its surface, and then reattached, or is replaced with a new one.

As described above, by providing the plate member 16a, whose end portion has the curved surface shape, on the inner side of the plasma shielding member 16, the plate member 16a to which target particles are scattered to adhere is formed only by a curved surface or a flat surface.

That is, like the fourth embodiment, this structure can prevent film separation during the long-term operation and make the film separation itself hard to occur, thereby further prolonging the maintenance cycle.

Further, by detachably providing the plate member 16a, cleaning is facilitated.

While this invention has been described in connection with the embodiments, the magnet sizes, the substrate sizes, and the like are not limited to the embodiments.

INDUSTRIAL APPLICABILITY

A magnetron sputtering apparatus according to this invention can be not only used for forming an insulating film or a conductive film on a semiconductor wafer or the like, but also applied for forming various films on a substrate such as a glass substrate of a flat display device, and can be used for sputtering film formation in the manufacture of storage devices or other electronic devices.

This application claims the benefit of priority from Japanese Patent Application No. 2007-67940, filed on Mar. 16, 2007, and Japanese Patent Application No. 2007-099778, filed on Apr. 5, 2007, the disclosure of which is incorporated herein in its entirety by reference.

What is claimed is:

1. A magnetron sputtering apparatus comprising a backing plate to which a target is held facing a substrate to be processed, and a magnet disposed on a back side of said target relative to said substrate, and adapted to confine plasma on a target surface by forming a magnetic field on the target surface using said magnet, wherein:

said magnet comprises a rotary magnet group having a plurality of plate magnets arranged on outer periphery of a columnar rotary shaft facing said plate magnets' surface to a radial direction of the columnar rotary shaft such that the plate magnets are bonded to a surface of the columnar rotary shaft so as to form a plurality of helices and a fixed outer circumferential frame magnet which is arranged in parallel with the target surface around said rotary magnet group and which is magnetized in a direction perpendicular to the target surface;

a magnetic field pattern on the target surface moves with time by rotating said rotary magnet group along with said columnar rotary shaft;

said magnetron sputtering apparatus comprises a shielding member disposed on an opposite side of said target with respect to said rotary magnet group so as to cover an end portion of said target and to be spaced apart from said target, said shielding member being electrically grounded, and said shielding member extends in a direction the same as an axial direction of said columnar rotary shaft and forms a slit opening said target to said substrate; and said substrate is placed on a substrate placing stage and, while plasma is excited on the target surface by applying a DC power, a RF power, or a DC power and a RF power simultaneously to said target, said substrate is placed under the slit, and a distance between an upper surface of said substrate or said substrate placing stage and a lower surface of said shielding member is shorter than a mean free path of electrons in said plasma at a position of said shielding member and, said substrate moves in parallel with the target surface and is placed at a retreated position of said substrate which is other than under the slit upon plasma ignition or extinction, and a distance in a vertical direction between the upper surface of said substrate or said substrate placing stage and the lower surface of said shielding member is shorter than a mean free path of electrons at a position of said shielding member, and a distance in a parallel direction between an end portion of said substrate at a side of the slit and an end portion of said shielding member at a side of the slit is longer than the mean free path of electrons at the position of said shielding member.

2. A magnetron sputtering apparatus according to claim 1, wherein:

said rotary magnet group is helical plate magnet groups forming a plurality of helices by helically disposing the plate magnets on said columnar rotary shaft such that the helices adjacent to each other in the axial direction of said columnar rotary shaft form mutually different magnetic poles of N-poles and S-poles on an outer side in a diameter direction of said columnar rotary shaft, and said fixed outer circumferential frame magnet is, as seen from a target side, configured to surround said rotary magnet group and forms a magnetic pole of N-pole or S-pole on the target side.

3. A magnetron sputtering apparatus according to claim 1, wherein at least part of said columnar rotary shaft is a paramagnetic substance.

4. A magnetron sputtering apparatus according to claim 1, wherein a fixed outer peripheral paramagnetic member is disposed adjacent to said fixed outer circumferential frame magnet on an opposite side of said fixed outer circumferential frame magnet relative to said target.

5. A magnetron sputtering apparatus according to claim 1, wherein said shielding member extends in the direction the same as the axial direction of said columnar rotary shaft and forms therealong the slit opening said target to said substrate and a width and a length of said slit are set so that, when said substrate is fixed and said plate magnet group is rotated at a constant frequency, a region of said substrate is shielded such that a film thickness to be formed per unit time is 80% or less of a maximum film thickness to be formed on said substrate per unit time when an end portion of said target is not shielded.

6. A magnetron sputtering apparatus according to claim 1, wherein said rotary magnet group and said fixed outer circumferential magnet are disposed in a space surrounded by said target, a backing plate to which said target is held, and a wall surface continuously extended from the periphery of said backing plate and said space can be reduced in pressure.

7. A magnetron sputtering apparatus according to claim 6, wherein said backing plate has a thickness smaller than an initial thickness of said target.

* * * * *